(12) United States Patent
Nishide

(10) Patent No.: US 8,049,491 B2
(45) Date of Patent: Nov. 1, 2011

(54) POSITION DETECTING DEVICE, AND SEAT POSITION DETECTING DEVICE OF VEHICLE

(75) Inventor: Harutomi Nishide, Utsunomiya (JP)

(73) Assignee: Honda Motor Co., Ltd., Tokyo (JP)

( * ) Notice: Subject to any disclaimer, the term of this patent is extended or adjusted under 35 U.S.C. 154(b) by 221 days.

(21) Appl. No.: 12/310,664

(22) PCT Filed: Aug. 30, 2007

(86) PCT No.: PCT/JP2007/066883
§ 371 (c)(1),
(2), (4) Date: Mar. 3, 2009

(87) PCT Pub. No.: WO2008/029702
PCT Pub. Date: Mar. 13, 2008

(65) Prior Publication Data
US 2010/0026283 A1 Feb. 4, 2010

(30) Foreign Application Priority Data
Sep. 6, 2006 (JP) .................................. 2006-241968

(51) Int. Cl.
*G01B 7/14* (2006.01)
*G01B 33/00* (2006.01)
(52) U.S. Cl. ......... 324/207.24; 324/207.22; 324/207.26; 324/228; 324/262
(58) Field of Classification Search . 324/207.11–207.26
See application file for complete search history.

(56) References Cited

U.S. PATENT DOCUMENTS

| | | | |
|---|---|---|---|
| 6,043,646 A * | 3/2000 | Jansseune | 324/207.26 |
| 6,784,774 B1 | 8/2004 | Okumura | |
| 6,798,196 B2 * | 9/2004 | Kojima et al. | 324/207.26 |
| 7,320,817 B2 * | 1/2008 | Kotani et al. | 428/34.1 |
| 7,400,947 B2 | 7/2008 | Endo et al. | |
| 7,614,597 B2 * | 11/2009 | Matsumoto et al. | 248/429 |
| 2004/0164826 A1 | 8/2004 | Okumura | |
| 2005/0021207 A1 | 1/2005 | Endo et al. | |
| 2006/0197521 A1 * | 9/2006 | Becker | 324/207.26 |

FOREIGN PATENT DOCUMENTS

JP 9-511357 11/1997

(Continued)

*Primary Examiner* — Huy Q Phan
*Assistant Examiner* — Emily Chan
(74) *Attorney, Agent, or Firm* — Carrier Blackman & Associates, P.C.; Joseph P. Carrier; William D. Blackman

(57) ABSTRACT

In a position detecting device including a movable member provided in a displaceable manner on a base member, and a proximity sensor which detects the position of the movable member, the proximity sensor includes a magnetic field generating portion, a detecting portion which detects a change in magnetic field according to the displacement of the movable member, and a protruding portion made of a nonmagnetic material, which protrudes toward an object to be detected. A seat position detecting device of a vehicle including the configuration of the position detecting device mentioned above is provided. The base member is comprised of a lower rail which is fixedly installed on a floor of a vehicle body, and the movable member is comprised of an upper rail which is attached to a seat for a vehicle and slidably engaged with the lower rail and which is allowed to be fixed in arbitrary sliding positions on the lower rail.

14 Claims, 7 Drawing Sheets

FOREIGN PATENT DOCUMENTS

| | | |
|---|---|---|
| JP | 2003-337004 A | 11/2003 |
| JP | 2004-210169 | 7/2004 |
| JP | 2004-259455 A | 9/2004 |
| JP | 2005-041245 A | 2/2005 |
| JP | 2006-151334 A | 6/2006 |

* cited by examiner

POSITION DETECTING DEVICE, AND SEAT POSITION DETECTING DEVICE OF VEHICLE

BACKGROUND OF THE INVENTION

1. Field of the Invention

The present invention relates to a position detecting device and a seat position detecting device of a vehicle which detect the position of a movable member provided in displaceable manner on a base member, by a proximity sensor, and relates to a position detecting device and a seat position detecting device of a vehicle, including a magnetic field generating portion, such as a permanent magnet, in the proximity sensor.

Priority is claimed on Japanese Patent Application No. 2006-241968, filed Sep. 6, 2006, the content of which is incorporated herein by reference.

2. Description of Related Art

As a position detecting device which detects the sliding position of a seat for a vehicle by a magnetic field detection type proximity sensor is known (for example, refer to PCT Japanese Translation Patent Publication No. 9-511357 and Japanese Patent Unexamined Publication No. 2003-337004).

In this position detecting device, for example, an object to be detected, which is made of a magnetic member, is provided at a side portion of a front end of a lower rail which is fixedly installed on the floor of a vehicle body, and a proximity sensor including a magnetic field generating portion (permanent magnet) and a detecting portion (Hall IC) is provided at an upper rail, which is integral with the seat for a vehicle.

In this position detecting device, when the proximity sensor moves according to sliding movement of the seat for a vehicle, the magnetic field of the magnetic field generating portion detected in the detecting portion changes according to the positional relationship between the proximity sensor and the object to be detected, and the sliding position of the seat is detected on the basis of the change of the magnetic field.

SUMMARY OF THE INVENTION

However, in this conventional position detecting device, the magnetic field generating portion (permanent magnet) is provided in the proximity sensor. Therefore, when a magnetic material, such as a minute screw or clip, exists around the proximity sensor, there is a concern that the magnetic force of the magnetic field generating portion attracts the magnetic material, and the magnetic material adheres to the periphery of the proximity sensor.

Thus, the present invention intends to provide the position detecting device and the seat position detecting device of a vehicle, which can prevent adhesion of a magnetic material to a proximity sensor beforehand, thereby improving detection precision.

In order to solve the above problem, the present invention provides a position detecting device (for example, a seat position detecting device 100 in an embodiment which will be described later) including a movable member (for example, an upper rail 2 in an embodiment which will be described later) provided in a displaceable manner on a base member (for example, a lower rail 1 in the embodiment which will be described later), and a proximity sensor (for example, a proximity sensor 20 in the embodiment which will be described later) which detects the position of the movable member. The proximity sensor is provided with a magnetic field generating portion (for example, a permanent magnet 25 in the embodiment which will be described later), a detecting portion which detects a change in magnetic field according to a displacement of the movable member (for example, a Hall IC 26 in the embodiment which will be described later), and a protruding portion (for example, a protruding portion 29 in the embodiment which will be described later) made of a nonmagnetic material, which protrudes toward an object to be detected (for example, a locking plate 8 in the embodiment which will be described later).

Thereby, even if a minute magnetic material in the surrounding area tries to approach the magnetic field generating portion of the proximity sensor, the magnetic material is blocked by the protruding portion made of a nonmagnetic material, and approach thereof to the magnetic field generating portion is prevented.

In a first preferable example, the protruding portion is formed of a flexible member such that a protruding height thereof from a root portion is greater than a separation width between the root portion and an object to be detected, and is allowed to abut against the object to be detected.

This allows the protruding portion to abut against an object to be detected. As a result, while the protruding portion is in contact with the object to be detected, a minute magnetic material hardly enters a gap between both the protruding portion and the object to be detected.

In a second preferable example, the proximity sensor includes a casing (for example, casing 24 in the embodiment which will be described later) made of a nonmagnetic material, which houses the magnetic field generating portion and the detecting portion, and the protruding portion is formed integrally with the casing.

For example, the protruding portion and the casing may be integrally formed of a resin material.

In a first typical example, the object to be detected is a magnetic member included in or provided at either one of the base member or the movable member or a magnetic member provided in any one of the base member and the movable member, and the proximity sensor is provided at the other one of the base member or the movable member to detect approach of the magnetic member.

Thereby, when the movable member is displaced on the base member and the proximity sensor approaches the object to be detected, the magnetic field detected in the detecting portion of the proximity sensor will change.

In a second typical example, the proximity sensor is arranged such that the magnetic field generating portion is formed of a substantially U-shaped permanent magnet, and a pair of legs of the substantially U-shaped permanent magnet is arranged along a displacement direction of the movable member, the detecting portion is arranged between the legs, and the protruding portion is provided in proximity to each of the legs.

In this case, preferably, the permanent magnet has a predetermined width in a direction perpendicular to the displacement direction of the movable member, and the protruding portion is formed over approximately the same range as the predetermined width of the permanent magnet.

Thereby, a surrounding minute magnetic material hardly approaches the legs of the permanent magnet. As a result, a detection result in the detecting portion is less influenced by the surrounding magnetic material.

In a third typical example, the protruding portions are arranged on both sides of the detecting portion so as to sandwich the detecting portion in the displacement direction of the movable member.

Additionally, the present invention includes a seat position detecting device of a vehicle including the configuration of the position detecting device mentioned above. The base member is comprised of a lower rail which is fixedly installed on a floor of a vehicle body, and the movable member is comprised of an upper rail which is attached to a seat for a vehicle and slidably engaged with the lower rail and which is allowed to be fixed in arbitrary sliding positions on the lower rail.

According to the above position detecting device, a surrounding minute magnetic material which tries to approach the magnetic field generating portion of the proximity sensor can be averted by the protruding portion made of a nonmagnetic material which protrudes toward an object to be detected from the proximity sensor. Therefore, adhesion of the surrounding magnetic material to the proximity sensor can be prevented beforehand, and an improvement in detection precision can be achieved.

According to the above-mentioned first preferable example, the protruding portion contacts the object to be detected and entering of a minute magnetic material to a gap between both the protruding portion and the object to be detected is prevented. Therefore, adhesion of the magnetic material to the proximity sensor can be prevented more advantageously.

Additionally, even if a minute magnetic material adheres to the object to be detected or the protruding portion, the magnetic material can be shaken off by the contact between the protruding portion and the object to be detected. Therefore, the detection precision of the proximity sensor can always be kept high.

According to the above second preferable example, the protruding portion which prevents adhesion of a magnetic material to the proximity sensor is formed integrally with the casing made of a nonmagnetic material, which houses the magnetic field generating portion and the detecting portion, deterioration, such as peeling of the protruding portion, hardly occurs. In addition, manufacture becomes easy. As a result, an improvement in product cycle and a reduction in manufacturing cost can be achieved.

According to the above first typical example, an object to be detected by the proximity sensor is a magnetic member as any one of the base member and the movable member or a magnetic member provided in any one of the base member and the movable member. Therefore, a magnetic metal part or the like having other functions can be shared as the object to be detected, and the number of parts can be reduced.

According to the above second typical example, the protruding portion is provided in proximity to each of the legs of the substantially U-shaped permanent magnet, a surrounding minute magnetic material can be reliably prevented from adhering to a position close to the leg of the permanent magnet, and adverse effect of the surrounding minute magnetic material to a detected result can be reduced more reliably.

According to the third typical example, the protruding portions are arranged on both sides of the detecting portion so as to sandwich the detecting portion. Therefore, a surrounding minute magnetic material can be prevented from affecting the detection performance of the detecting portion, and an improvement in detection precision can be achieved.

According to the above seat position detecting device of a vehicle, adhesion of a minute magnetic material to the magnetic field generating portion of the proximity sensor can be reliably prevented under an environment where a minute magnetic material, such as a screw, a washer, or a stapler, may enter. Therefore, the detection precision of a seat position can be further improved.

DETAILED DESCRIPTION OF THE INVENTION

Hereinafter, one embodiment of the invention will be described with reference to the accompanying drawings.

FIGS. 1 to 8 show a seat sliding apparatus of a vehicle, and a seat position detecting device 100 for detecting the front-rear sliding position of a seat is built into this seat sliding apparatus. A detection signal of this seat position detecting device 100 is used for controlling, for example, the deployment output of an air bag or the ignition timing of an inflator according to the front-rear sliding position of the seat.

Figure 1:
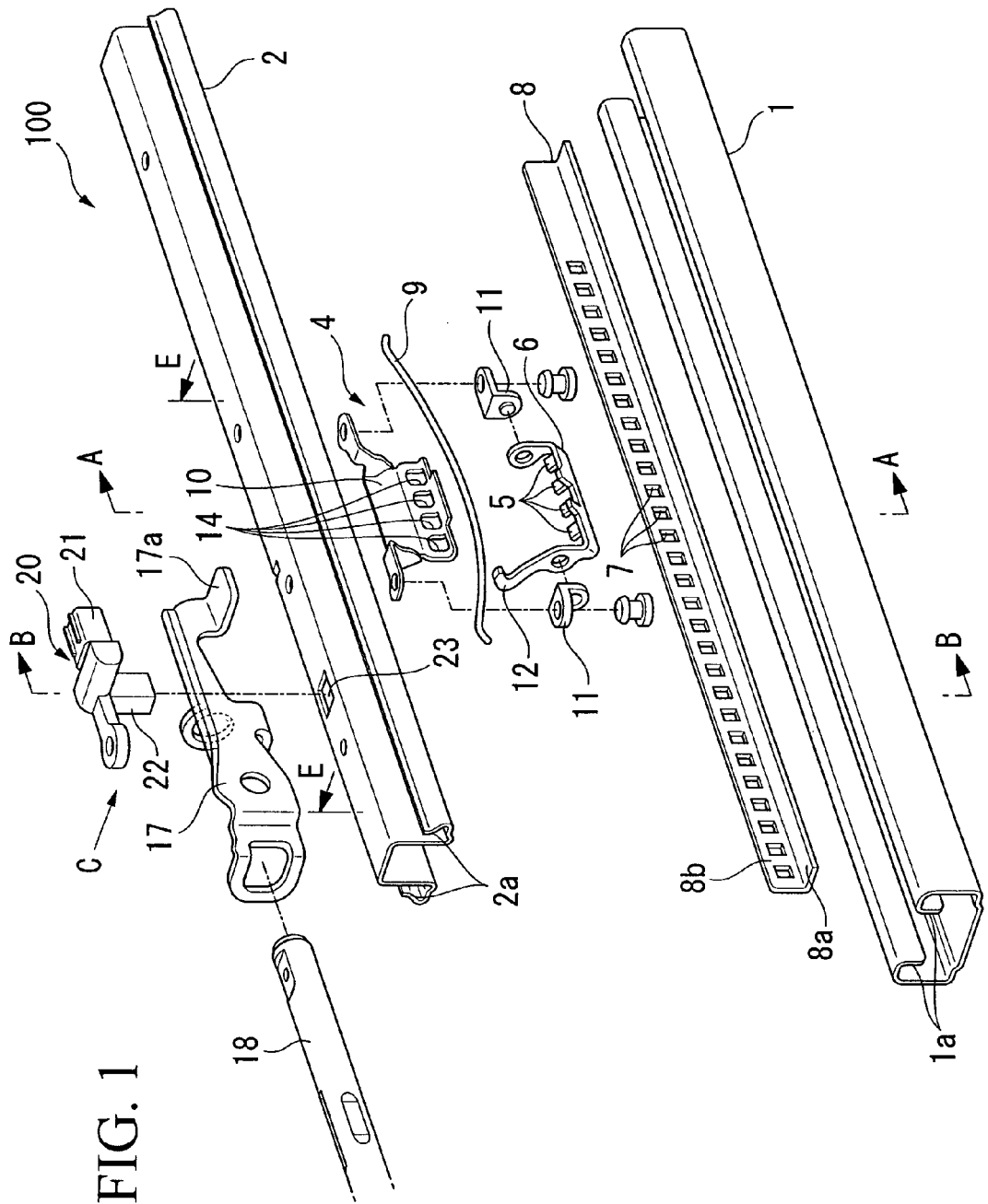
FIG. 1 is an exploded perspective view showing one embodiment of the present invention.

The seat sliding apparatus, as shown in FIG. 1, includes a lower rail 1 (base member) fixedly installed on the floor of the vehicle, and an upper rail 2 (movable member) attached to a bottom surface of the seat. The lower rail 1 and the upper rail 2 are assembled together so as to be slidable (the upper rail 2 slides on the lower rail 1) in a longitudinal direction (front-rear direction of a vehicle body) via a sliding member, such as a roller, which is not shown.

The lower rail 1 has downwardly curved portions 1a, which are curved inwardly downward in a width direction, formed at upper ends of both side walls of a cross-section of a substantially U-shaped base whose upper side opens, and is fixedly fastened to the floor of the vehicle in the vicinity of both longitudinal ends of a bottom wall thereof. Meanwhile, the upper rail 2 has upwardly curved portions 2a, which are curved outwardly upward in a width direction, formed at lower ends of both side walls of a cross-section of a substantially (inverted) U-shaped base whose lower side opens. The upper rail 2 is fitted into an opening of the lower rail 1, and both the upwardly curved portions 2a thereof face inner surfaces of the downwardly curved portions 1a of the lower rail 1.

Additionally, a locking mechanism 4 for fixing the upper rail 2 in an arbitrary sliding position is provided between the upper rail 2 and the lower rail 1. The locking mechanism 4 includes a substantially U-shaped latch lever 6 which is rockably supported by the upper rail 2, and has a plurality of locking claws 5, a locking plate 8 which is combined with the lower rail 1 and has a plurality of fitting holes 7 which is allowed to fit to the locking claws 5, a rod-shaped spring 9 which urges the locking claws 5 in the direction toward the fitting holes 7, and a claw supporting plate 10 which engages and supports root portions of the locking claws 5 on the near side (side where a base wall 8a (which will be described later) exists) of the locking plate 8 at the time of locking.

The rod-shaped spring 9 is adapted to be supported by an upper wall of the upper rail 2 at both ends thereof and to urge the latch lever 6 in the direction of the locking plate 8 at a curved central portion thereof.

The latch lever 6 is rotatably attached to an inner surface of the upper wall of the upper rail 2 via shaft supporting members 11, and one end thereof is integrally provided with an input arm 12 for introducing an operating force from the outside.

The locking plate 8 extends along the longitudinal direction of the lower rail 1, and is fixedly installed on an inside bottom surface of the lower rail 1. The locking plate 8 is formed so as to have a substantially L-shaped cross-section from a magnetic metal (magnetic member), and the base wall 8a which forms the bottom surface of the locking plate is combined with approximately the middle of the lower rail 1 in its width direction by spot welding or projection welding, and a vertical wall 8b extends at one end of the base wall in its width direction. A plurality of fitting holes 7 is formed at equal intervals in the longitudinal direction in the vertical wall 8b, and the locking claws 5 of the latch lever 6 are adapted to be able to fit into the arbitrary fitting holes 7.

Figure 2:
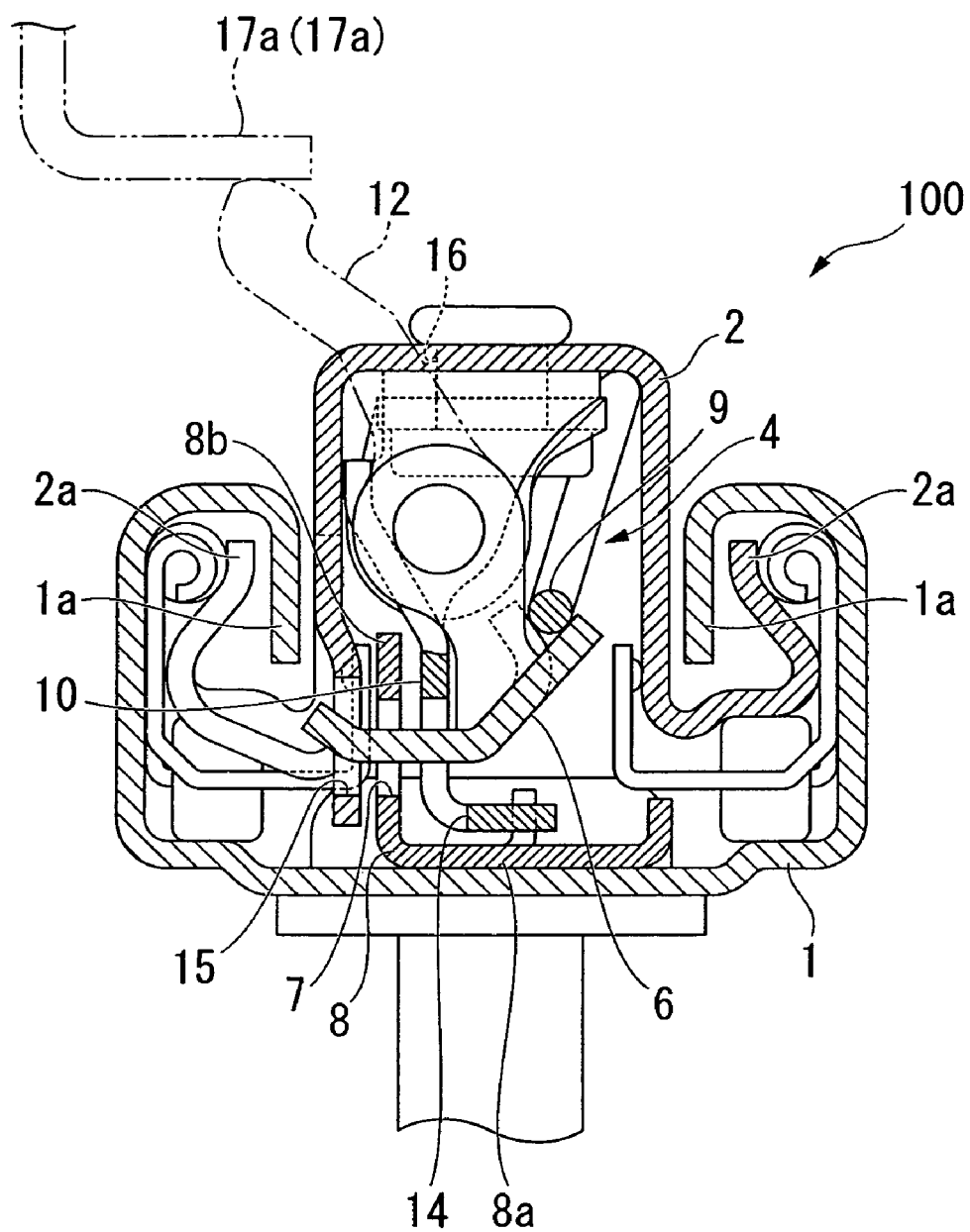
FIG. 2 is a cross-sectional view corresponding to an A-A cross-section of FIG. 1, showing the embodiment.

The claw supporting plate 10 is provided with a plurality of supporting holes 14 into which the root portions of the locking claws 5 of the latch lever 6 are inserted and engaged, and is fixedly installed on the bottom surface of the upper wall of the upper rail 2. Also, supporting holes 15 into which tip portions of the locking claws 5 of the latch lever 6 are inserted and engaged as shown in FIG. 2 are formed in the positions of one side wall of the upper rail 2 corresponding to the supporting holes 14 of the claw supporting plate 10. When the locking claws 5 of the latch lever 6 are fitted and engaged into the arbitrary fitting holes 7 on the locking plate 8, the supporting holes 14 of the claw supporting plate 10 and the supporting holes 15 of the upper rail 2 support the root portions and tip portions of the locking claws 5 before and behind the locking plate 8.

Additionally, as shown in FIG. 2, an aperture 16 is formed to the upper rail 2 so as to span one side wall and upper wall of the upper rail, and the input arm 12 of the latch lever 6 protrudes to the outside of the upper rail 2 through the aperture 16. Meanwhile, as shown in FIG. 1, a holder 17 is attached to the outer surface of the upper rail 2 so as to be rockable up and down via a bracket which is not shown, and a base end of an operating lever 18 for unlocking is supported by the holder 17. The holder 17 is provided with an operating piece 17a which is engaged with the input arm 12 of the latch lever 6, and this operating piece is adapted to be able to operate to rock the latch lever 6 in an unlocking direction by the upward rocking operation of the operating lever 18. Specifically, when the operating lever 18 is rotationally operated upward, the operating piece 17a is adapted to push down the input arm 12, and thereby to rotationally operate the latch lever 6 in a direction which the latch lever 6 pulls out the locking claws 5 from the fitting holes 7 against the urging force of the rod-shaped spring 9.

Figure 3:
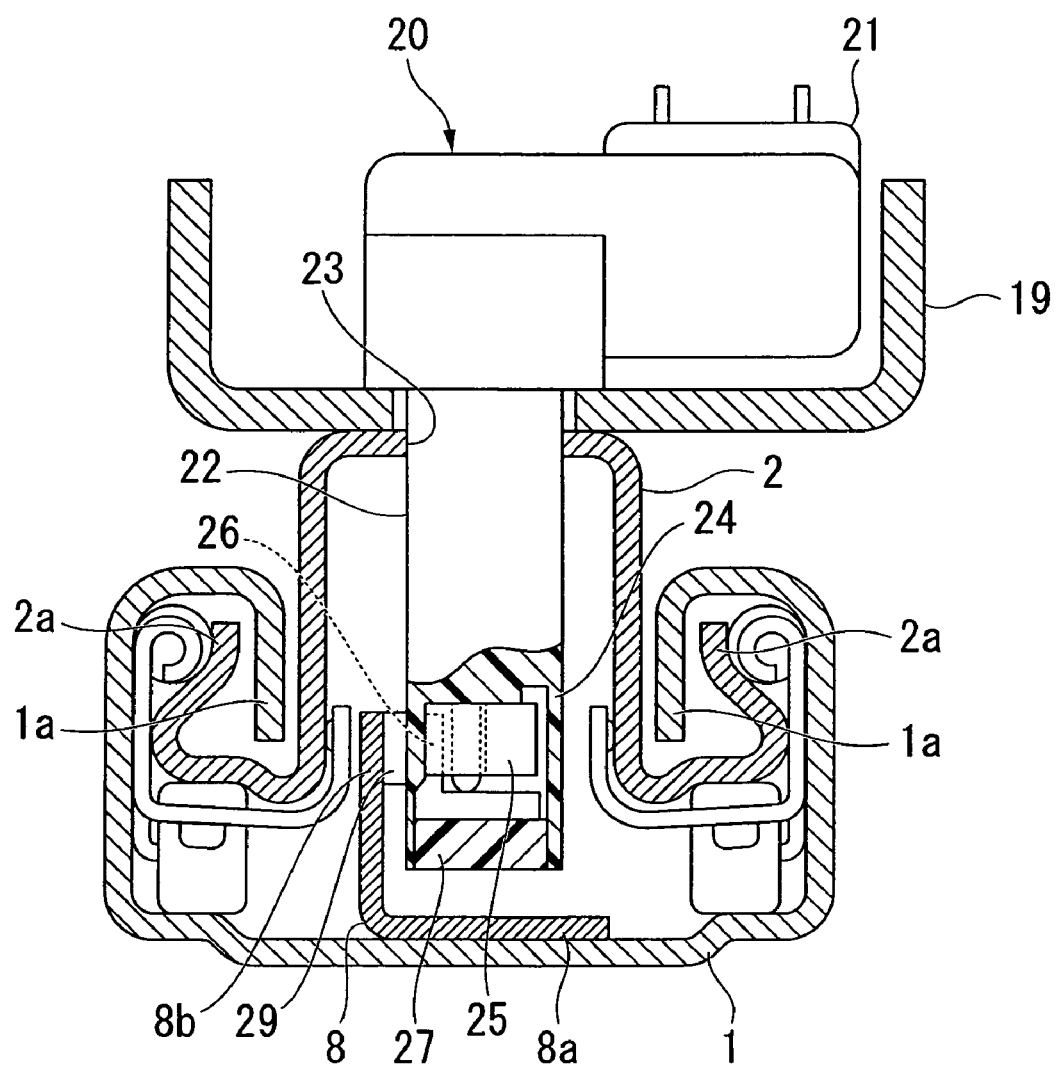
FIG. 3 is a cross-sectional view corresponding to a B-B cross-section of FIG. 1, showing the embodiment.
Figure 4:
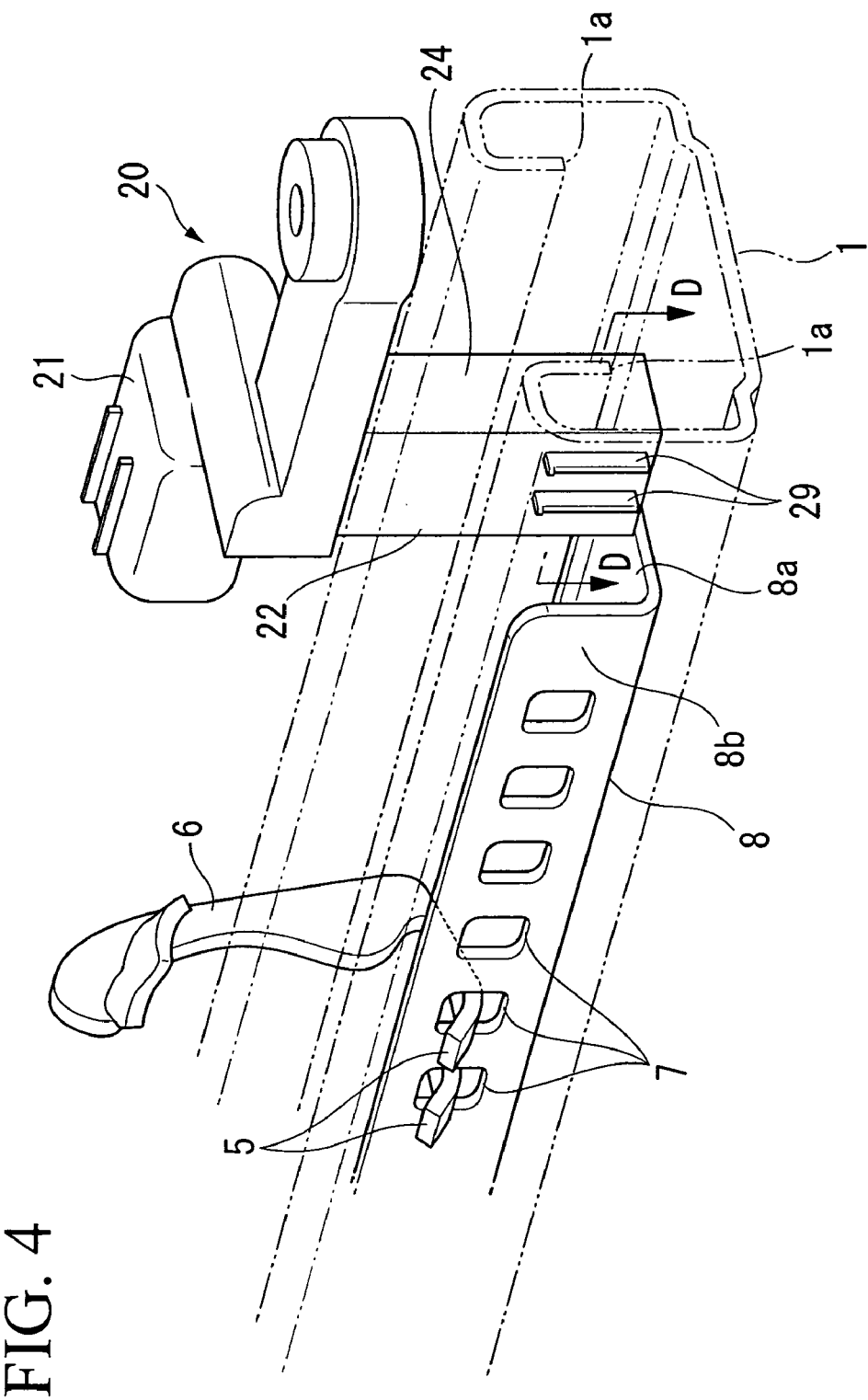
FIG. 4 is a perspective view corresponding to an arrow C of FIG. 1, showing the embodiment.
Figure 7:
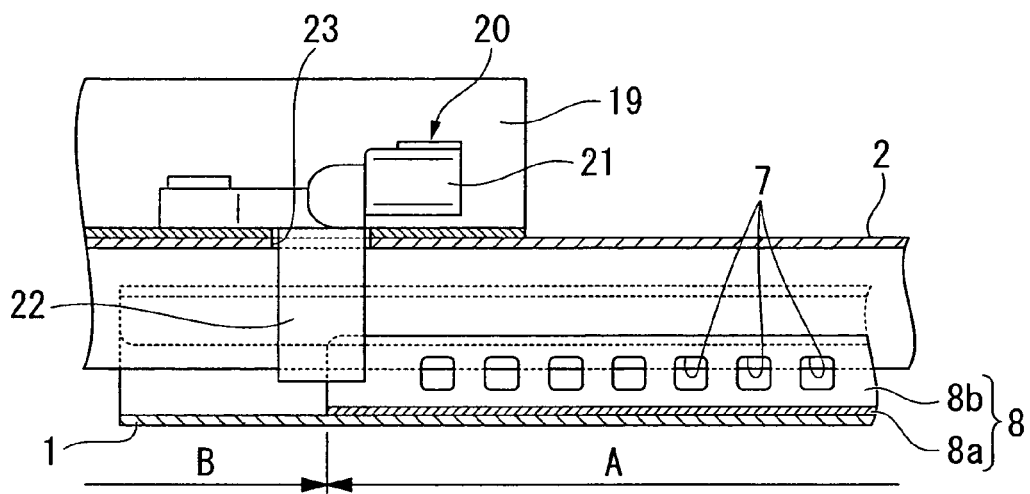
FIG. 7 is a cross-sectional view corresponding to a E-E cross-section of FIG. 1, showing the embodiment.

Meanwhile, a magnetic field detection type proximity sensor 20 is attached to a position nearer the front of a vehicle body than the locking mechanism 4 of the upper wall of the upper rail 2 via a bracket 19 shown in FIGS. 3 and 7. In addition, illustration of the bracket 19 is omitted in FIG. 1.

The proximity sensor 20 includes a terminal block 21 which connects a wiring connector of an electrical system, and a sensor block 22 of a rectangular cross-section which extends in a direction substantially orthogonal to the terminal block 21, and the sensor block 22 is arranged inside the upper rail 2 through a through hole 23 formed in the upper wall of the upper rail 2.

As for the sensor block 22, a casing 24 is formed from a nonmagnetic and elastic resin material, and as shown in FIGS. 3 to 6, a substantially U-shaped permanent magnet 25 serving as a magnetic field generating portion and an Hall IC 26 serving as a detecting portion which detects a magnetic field are housed inside the casing 24. The permanent magnet 25 and the Hall IC 26 are loaded into the inside of the casing 24 through an opening of a lower end of the casing, and then, the opening is sealed by a potting material 27 (refer to FIG. 3). In the sensor block 22, the direction of tips of a pair of legs 25A and 25A of the substantially U-shaped permanent magnet 25 is defined as a detecting direction, and the side wall of the casing 24 located ahead of both the legs 25A and 25A is adapted to face the vertical wall 8b of the locking plate 8 in a proximity state. Here since the vertical wall 8b of a locking plate 8, as shown in FIG. 7, exists in a region A on the rear side from a region B at a front end on the lower rail 1, the sensor block 22 faces the vertical wall 8b only when the sensor block 22 is within the region A. The locking plate 8 is formed from a magnetic metal as mentioned above, and is used as an object to be detected by the proximity sensor 20.

Here, the detection principle of the proximity sensor 20 of this embodiment will be described with reference to FIGS. 8A and 8B.

The substantially U-shaped permanent magnet 25 is comprised of first and second magnet pieces 25a and 25b whose lengths are equal to each other, and a third magnet piece 25c which is interposed between the first and second magnet pieces 25a and 25b and is shorter than both the magnet pieces 25a and 25b, and the respective magnet pieces 25a, 25b, and 25c are joined together such that the same magnetic poles point the same direction.

Figure 8A:
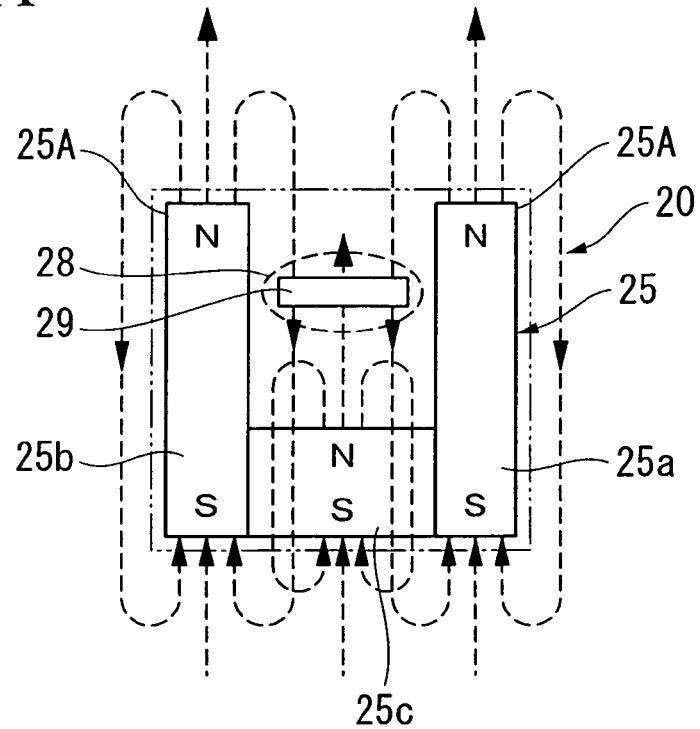
FIG. 8A is a principle view of a proximity sensor to be used in the embodiment.
Figure 8B:
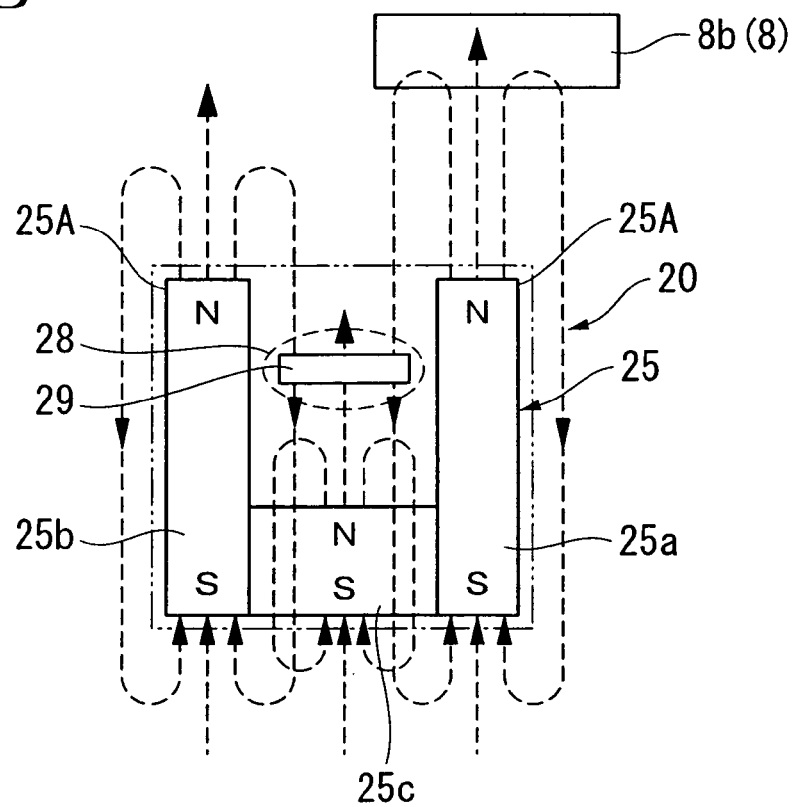
FIG. 8B is similarly a principle view of the proximity sensor to be used in the embodiment.

In the permanent magnet 25 formed in the shape of the letter U, the magnetic field by the first and second magnet pieces 25a and 25b and the magnetic field by the third magnet piece 25c are cancelled by each other and a total magnetic field becomes zero, at a certain position between the legs 25A and 25A shown in FIGS. 8A and 8B. The Hall IC 26 is arranged in a magnetic field zero region 28 between the legs 25A and 25A. The total magnetic field becomes zero only when the magnetic field of the permanent magnet 25 is not influenced by external magnetic members. As shown in FIG. 8B, when the tip side of the leg 25A of the permanent magnet 25 approaches the locking plate 8 (the vertical wall 8b) that is a magnetic member, the magnetic field which acts on the Hall IC 26 increases.

Accordingly, in the proximity sensor 20, the Hall IC 26 outputs different detection signals when the leg 25A of the permanent magnet 25 lies close to the locking plate 8 and when the leg is apart from the locking plate, and thereby the sliding position of a seat, i.e., whether the seat is at the front end or behind the front end can be detected.

Meanwhile, a pair of tongue-like protruding portions 29 and 29 is integrally formed on the surface of the casing 24 which faces the vertical wall 8b of the locking plate 8. Each protruding portion 29 is formed over approximately the same range in the height direction as the permanent magnet 25 on the front side of each leg 25A of the permanent magnet 25. Additionally, the protruding height of each protruding portion 29 headed in the direction of the vertical wall 8b is greater than the separation width between the casing 24 of the proximity sensor 20, and the vertical wall 8b of the locking plate 8, and when the proximity sensor 20 is in a position where the sensor faces the vertical wall 8b, a tip portion of the protruding portion 29 is adapted to be bent and contact a side surface of the vertical wall 8b.

When the front-rear position of a seat is adjusted in the above configuration, a driver pulls up the operating lever 18, whereby the locking claws 5 of the latch lever 6 are pulled out of the fitting holes 7 of the locking plate 8, and in this state, the seat is slidingly adjusted to an arbitrary front-rear position. Then, when the pull-up of the operating lever 18 is released, the latch lever 6 is again urged by the rod-shaped spring 9, and the locking claws 5 is inserted and engaged into the corresponding fitting holes 7 on the locking plate 8.

The front-rear position of a seat is freely adjusted this way. However, when the seat is behind the position of the front end thereof, the proximity sensor 20 faces the vertical wall 8b of the locking plate 8 in the region A of FIG. 7, and the Hall IC 26 of the sensor 20 outputs a current signal, meaning that the seat is in positions other than the position of the front end, to a controller (not shown).

Additionally, when the seat is in the position of the front end, the proximity sensor 20 is located within the region B of FIG. 7 where the sensor does not face the vertical wall 8b, and the Hall IC 26 of the sensor 20 outputs a current signal, meaning that the seat is in the position of the front end, to a controller (not shown).

Figure 5:
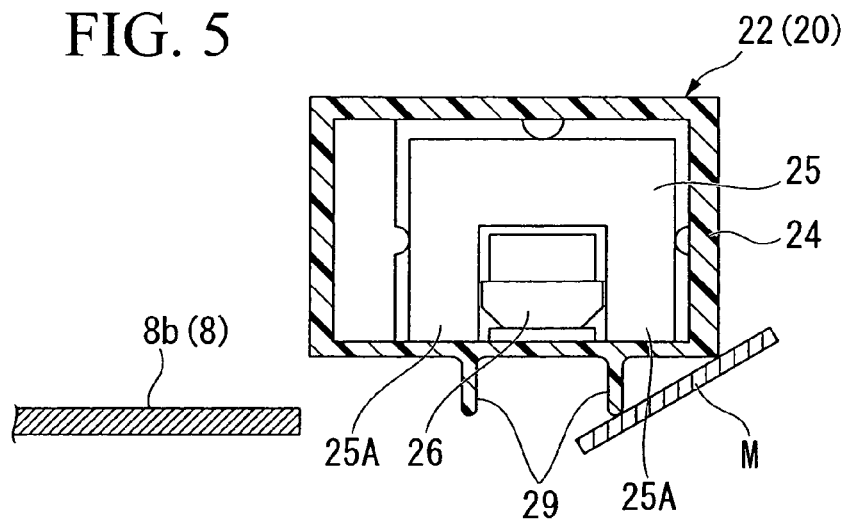
FIG. 5 is an enlarged cross-sectional view corresponding to a D-D cross-section of FIG. 4, showing the embodiment.
Figure 6:
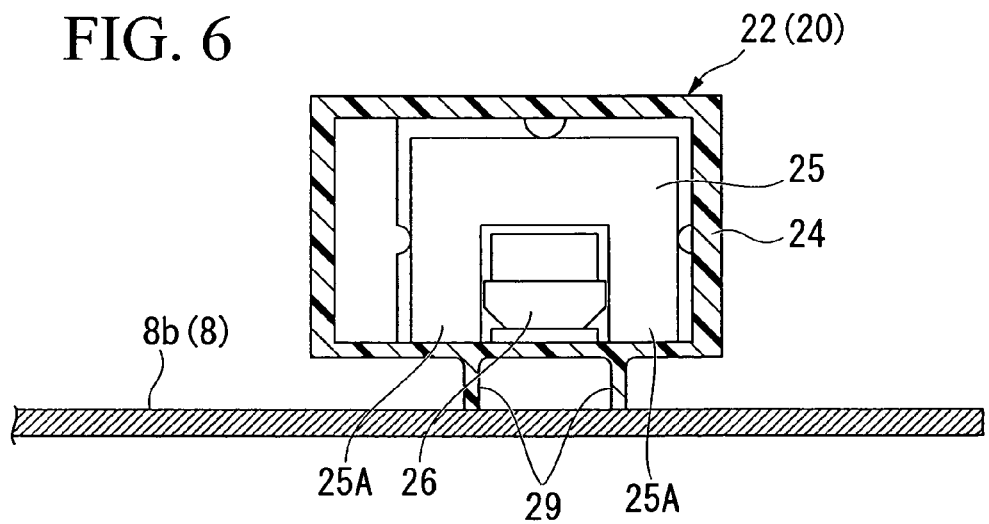
FIG. 6 is an enlarged cross-sectional view corresponding to a D-D cross-section of FIG. 4, showing the embodiment.

In the seat position detecting device 100, each nonmagnetic protruding portion 29 is formed in a position ahead of each leg 25A of the permanent magnet 25 in the casing 24 of the proximity sensor 20. Therefore, as shown in FIG. 5, even if a minute magnetic material M, such as a screw, a washer, or a stapler, exist around the proximity sensor 20, the protruding portion 29 reliably prevents approach of the magnetic material M to the vicinity of the leg 25A of the permanent magnet 25. Accordingly, the surrounding minute magnetic material M is prevented from affecting the detected result of the proximity sensor 20, and the detection precision of a seat position is improved. Additionally, even when the seat is in the position of the front end, since the proximity sensor 20 has the protruding portion 29 made of a nonmagnetic material, the minute magnetic material M can be prevented from approaching the proximity sensor 20 irrespective of a seat position.

Additionally, in the seat position detecting device 100, the protruding height of the protruding portion 29 is set to be greater than the separation width between the proximity sensor 20 and the vertical wall 8b of the locking plate 8. Therefore, when the seat is in positions other than the position of the front end, each protruding portion 29 abuts on the vertical wall 8b of the locking plate 8. As a result, the vertical wall 8b functions as a wall which prevents the magnetic material M from entering between the adjacent protruding portions 29 and 29. Accordingly, when the seat is in positions other than the position of the front end, adhesion of the magnetic material M to the proximity sensor 20 can be more effectively prevented by the cooperation between the protruding portion 29 and the vertical wall 8b.

Moreover, in the position detecting device 100, each protruding portion 29 is formed of an elastic resin material, and the protruding portion 29 and the vertical wall 8b are adapted to come into sliding contact with each other at the time of sliding adjustment of the seat. Therefore, even if the magnetic material M has adhered to the protruding portion 29 or the vertical wall 8b, the adhered magnetic material M can be shaken off by the sliding contact between the protruding portion 29 and the vertical wall 8b. In particular, in this embodiment, the plurality of fitting holes 7 is formed along the longitudinal direction in the vertical wall 8b against which the tip portion of the protruding portion 29 abuts. Therefore, the magnetic material M can be more effectively shaken off by the intermittent abutment of the protruding portion 29 against edges of the fitting holes 7 accompanying seat sliding.

Additionally, in the apparatus 100 of this embodiment, the protruding portion 29 is integrally formed in the casing 24 made of resin. Therefore, the protruding portion 29 and the casing 24 can be easily formed by die forming or the like as well as the deterioration that the protruding portion 29 is peeled off by the input of load from the outside. Accordingly, an improvement in product cycle and a reduction in manufacturing cost can be achieved by forming the protruding portion 29 integrally with the casing 24 in this way.

However, if such an advantage is not considered, the protruding portion 29 can be formed separately from the casing 24, and the protruding portion 29 can be fixed to the casing 24 later by bonding or the like. Additionally, the protruding portion 29 may be formed of the potting material 27 which seals the opening of the lower end of the casing 24.

In addition, the present invention is not limited to the above embodiment, and various design changes can be made without departing from the scope thereof. For example, although the seat position detecting device of a vehicle has been described above, the same configuration can also be applied to position detecting devices other than the seat. Additionally, the above embodiment has been described that the proximity sensor is provided on the side of the upper rail which is a movable member and the magnetic member that is an object to be detected is provided on the side of the lower rail. Contrary to this, however, the proximity sensor may be provided on the side of the lower rail and the magnetic member that is an object to be detected on the side of the upper rail.

According to the position detecting device of the present invention, a surrounding minute magnetic material which tries to approach the magnetic field generating portion of the proximity sensor can be averted by the protruding portion made of a nonmagnetic material which protrudes toward an object to be detected from the proximity sensor. Therefore, adhesion of the surrounding magnetic material to the proximity sensor can be prevented beforehand, and an improvement in detection precision can be achieved.

Additionally, if this is applied as the seat position detecting device of a vehicle, adhesion of a minute magnetic material to the magnetic field generating portion of the proximity sensor can be reliably prevented under an environment where a minute magnetic material, such as a screw, a washer, or a stapler, may enter. Therefore, the detection precision of a seat position can be further improved.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A position detecting device comprising:
   a movable member provided in a displaceable manner on a base member, and a proximity sensor which detects the position of the movable member,
   wherein the proximity sensor is provided with a magnetic field generating portion, a detecting portion which detects a change in magnetic field according to a displacement of the movable member, a casing made of a nonmagnetic material, which houses the magnetic field generating portion and the detecting portion, and a protruding portion made of a nonmagnetic material disposed on an exterior side of the casing, which protrudes toward an object to be detected, and
   wherein the protruding portion is formed of a flexible member having a root portion adjacent the casing and extending to a tip portion opposite the root portion such that a protruding height thereof from the root portion to the tip portion is greater than a separation width between the root portion and the object to be detected, and the protruding portion is allowed to abut against the object to be detected.

2. The position detecting device according to claim 1, wherein the protruding portion and the casing are formed as an integral unit.

3. The position detecting device according to claim 2, wherein integral unit of the protruding portion and the casing is formed of a resin material.

4. The position detecting device according to claim 1, wherein the object to be detected is a magnetic member included in or provided at either one of the base member or the movable member, and the proximity sensor is provided at the other one of the base member or the movable member to detect approach of the magnetic member.

5. The position detecting device according to claim 1, wherein the proximity sensor is arranged such that the magnetic field generating portion is formed of a substantially U-shaped permanent magnet, a pair of legs of the substantially U-shaped permanent magnet is arranged along a displacement direction of the movable member with end portions thereof abutting an interior side of the casing, the detecting portion is arranged between the pair of legs, and the protruding portion is provided adjacent to the end portions of each of the pair of legs.

6. The position detecting device according to claim 5, wherein the permanent magnet has a width in a direction perpendicular to the displacement direction of the movable member, and the protruding portion extends along a distance substantially similar to the width of the permanent magnet.

7. A seat position detecting device of a vehicle including the configuration of the position detecting device according to claims 1, wherein the base member is comprised of a lower rail which is fixedly installed on a floor of a vehicle body, and the movable member is comprised of an upper rail which is attached to a seat for a vehicle and slidably engaged with the lower rail and which is allowed to be fixed in an arbitrary sliding position on the lower rail.

8. A position detecting device, comprising a movable member provided in a displaceable manner on a base member, and a proximity sensor which detects the position of the movable member, wherein the proximity sensor is provided with a magnetic field generating portion, a detecting portion which detects a change in magnetic field according to a displacement of the movable member, a casing made of a nonmagnetic material, which houses the magnetic field generating portion and the detecting portion, and a protruding portion made of a nonmagnetic material disposed on an exterior side of the casing, which protrudes toward an object to be detected, and wherein the protruding portion includes first and second tongue-like structures arranged on both sides of the detecting portion so as to sandwich the detecting portion in the displacement direction of the movable member.

9. The position detecting device according to claim 8, wherein the first and second tongue-like structures are arranged substantially parallel to each other and extend along a distance in the direction perpendicular to the displacement direction substantially similar to a width of the detecting portion in the direction perpendicular to the displacement direction.

10. A position detecting device comprising:

a movable member provided in a displaceable manner on a base member, and a proximity sensor which detects the position of the movable member, wherein the proximity sensor is provided with a magnetic field generating portion, a detecting portion which detects a change in magnetic field according to a displacement of the movable member, a casing made of a nonmagnetic material, which houses the magnetic field generating portion and the detecting portion, and a protruding portion made of a nonmagnetic material disposed on an exterior side of the casing, which protrudes toward an object to be detected; and wherein the protruding portion includes at least one tongue-like structure having a root portion attached to the casing and extending to a tip portion opposite the root portion, with the tip portion configured to selectively contact the object to be detected when positioned adjacent thereto.

11. The position detecting device according to claim 10, wherein the at least one tongue-like structure is flexible, and wherein a protruding height thereof from the root portion to the tip portion is greater than a separation width between the casing and the object to be detected such that the at least one tongue-like structure is configured to flexibly bend when in contact with the object to be detected.

12. The position detecting device according to claim 11, wherein the at least one tongue-like structure extends in a direction perpendicular to the displacement direction of the movable member along a distance substantially similar to one of the width of the magnetic field generating portion and the detecting portion.

13. The position detecting device according to claim 11, wherein the at least one tongue-like structure includes first and second tongue-like structures disposed on opposite sides of the detecting portion in the displacement direction of the movable member.

14. The position detecting device according to claim 13, wherein the first and second tongue-like structures each extend along a distance in a direction perpendicular to the displacement direction of the movable member that is substantially similar to the width in the same direction of one of the magnetic field generating portion and the detecting portion.

* * * * *